United States Patent [19]
Gill

[11] Patent Number: 5,418,741
[45] Date of Patent: May 23, 1995

[54] VIRTUAL GROUND MEMORY CELL ARRAY

[75] Inventor: Manzur Gill, Arcola, Tex.

[73] Assignee: Texas Instruments Incorporated, Dallas, Tex.

[21] Appl. No.: 178,077

[22] Filed: Jan. 6, 1994

Related U.S. Application Data

[62] Division of Ser. No. 60,472, May 27, 1993.

[51] Int. Cl.⁶ .................... H01L 29/68; H01L 29/78
[52] U.S. Cl. .................................... 365/182; 365/185; 257/335; 257/314; 437/43
[58] Field of Search .................. 365/182, 185, 900; 437/43; 357/23.5

[56] References Cited

U.S. PATENT DOCUMENTS

| | | | |
|---|---|---|---|
| 4,780,424 | 10/1988 | Holler et al. | 437/29 |
| 4,996,571 | 2/1991 | Kume et al. | 365/185 |
| 5,051,796 | 9/1991 | Gill | 357/23.5 |
| 5,077,230 | 12/1991 | Woo et al. | 437/43 |
| 5,102,814 | 4/1992 | Woo | 437/43 |
| 5,215,934 | 6/1993 | Tzeng | 437/43 |

*Primary Examiner*—Viet Q. Nguyen
*Attorney, Agent, or Firm*—Theodore D. Lindgren; Leo N. Heiting; Richard L. Donaldson

[57] ABSTRACT

A memory cell array for a nonvolatile memory device having single-transistor cells (10). Row lines (15) connect the control gates of each row of cells. Column lines (17) connect the drain regions (11) and source regions (12) of columns of cells, such that pairs of row-adjacent cells share a column line (17). Each shared column line (17) has two junctions for each pair of cells that share the column line. One junction is graded for source regions (12) and the other is abrupt for drain regions (11).

8 Claims, 3 Drawing Sheets

VIRTUAL GROUND MEMORY CELL ARRAY

This is a division of application Ser. No. 08/060,472 filed May 27, 1993.

TECHNICAL FIELD OF THE INVENTION

This invention relates to nonvolatile semiconductor memory devices, including electrically-programmable, read-only memories (EPROMs) and flash EEPROMs and to methods for making such devices.

BACKGROUND OF THE INVENTION

An ultraviolet-erasable, programmable read only memory (EPROM) is a non-volatile memory integrated circuit that is used to store binary data. The circuit has an array of memory cells, each having at least one transistor, and each capable of storing a bit of data. Power can be removed from the EPROM without loss of data. Upon re-applying power, the stored data may be retrieved.

If an EPROM has already been programmed, it may be erased by exposing it to ultraviolet light. Electrically erasable programmable read-only memories (EEPROMs) permit data to be erased electrically. In the case of a "flash" EEPROM, all data cells are electrically erased in one operation. Flash EEPROMs, like EPROMs, typically have a single-transistor architecture similar to those of EPROMs. For purposes of the description the term "EPROM" will be assumed to include flash EEPROMs.

In addition to its data retention ability, an EPROM may be programmed to store new data. New data is written to the EPROM by deactivating chip select lines to switch to data inputs. Address inputs are set to a starting value, the data is delivered to the data inputs, and the data is written to the cell identified by the address inputs. The address inputs are incremented, and the cycle is repeated for the entire array of cells.

A EPROM and its programming, reading, and erasing is described in U.S. Pat. No. 4,281,397, assigned to Texas Instruments Incorporated. The EPROM described therein is a virtual ground EPROM, in which source lines are connected to a virtual ground during programming.

FIG. 1A illustrates a typical prior art EPROM array. For programming virtual ground EPROMs, a selected row line 15 and selected drain [bit] line 17 are both driven high. They intersect at the memory cell to be written, which is comprised of a single transistor 10. The row line 15 is connected to the transistor gate 14 and the drain [bit] line 17 is connected to the transistor drain 11. A source line 19, connected to the transistor source 12, is held at virtual ground. Non-selected drain lines 17 and source lines 19 are floated. The programming voltages create a high current in the channel region (between source 12 and drain 11) of the selected cell. This results in the generation, near the drain-channel junction of hot electrons, which are injected to the floating gate 13 of the selected cell. The charge injected into the floating gate 13 is trapped there and stored in the cell until erased.

A problem with programming virtual ground EPROMs and flash EEPROMs is the occurrence of disturbances in cells adjacent to the cell that has been currently selected for programming. The disturbance occurs because non selected source lines may take a period of time to charge up. As a result, an unintended charge may occur in the adjacent cell, resulting in the adjacent cell to be in an unintended state or in a state with reduced margin to the unintended state. Circuit techniques have been developed to minimize the disturbs in virtual ground array architectures, adding to design complexity.

SUMMARY OF THE INVENTION

One aspect of the invention is an array of nonvolatile memory cells, having its source lines or drain lines connected to an appropriate voltage level for programming purposes. The array is built on a semiconductor layer of a first conductivity type. A number of memory cells are fabricated on the substrate, each cell having at least one transistor, with a source region, a drain region, a floating gate, and a control gate. Word lines connect the control gates of each row of cells of said array. Drain lines connect the drain regions of columns of cells of said array, such that every pair of row-adjacent cells shares a drain line. Source lines connect the source regions of columns of cells of said array, such that every pair of row-adjacent cells shares a source line. Each shared drain line and each shared source line has a first junction with the source/drain channel of one cell of its associated cell-pair that is abrupt and has a second junction with the source/drain channel of the other cell of its associated cell-pair that is graded.

Another aspect of the invention is a method for making an EPROM array that has a virtual ground, single-transistor cell, structure. A first photoresist pattern is formed on the surface of a substrate to define drain and source regions of the array transistors. This mask covers all portions of the substrate that are not source or drain regions. These drain and source regions are doped with a first dopant in areas not covered by the first photoresist pattern. A second photoresist pattern is formed, such that a portion of the drain and source regions as well as those areas that are not source or drain regions are covered. The non-covered areas are doped with a second dopant. The result is that source and drain regions doped only by the first dopant have an abrupt interface with the substrate, whereas source and drain regions doped with both dopants have a graded interface with the substrate.

A technical advantage of the invention is that during programming of the cells, it eliminates the problem of disturbing of cells adjacent to the cell being programmed. The array is compatible with existing designs for various types of EPROMs that use virtual ground programming, in particular, the contact-free and the X-cell designs.

DETAILED DESCRIPTION OF THE INVENTION

Figure 1A:
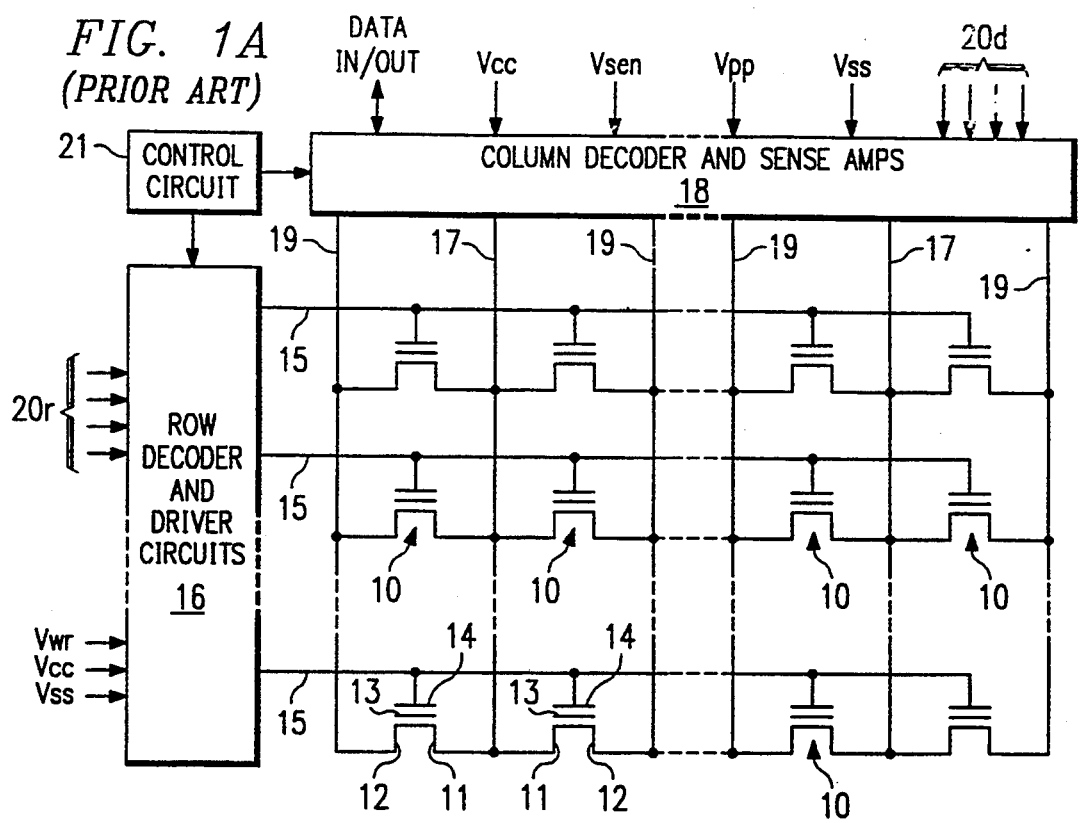
FIG. 1A is a prior art schematic representation of an EPROM array and related peripheral circuitry.
Figure 1B:
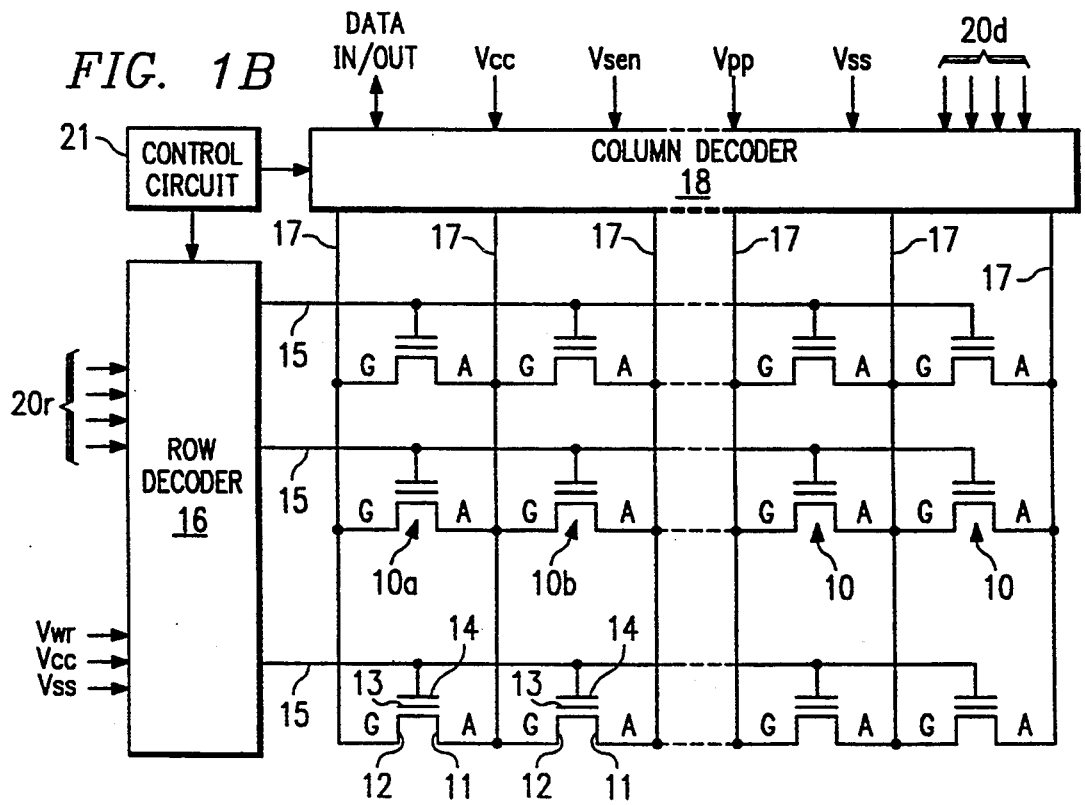
FIG. 1B illustrates the array of FIG. 1A with abrupt and graded junctions in accordance with the invention.

FIG. 1B illustrates an array of memory cells, typical of those to which the invention is applicable. Each cell has a single-transistor and stores one bit of data. Examples of such devices are "flash" electrically erasable EPROMs and ultraviolet erasable EPROMs. Because the array is comprised of single-transistor cells, the word "cell" is used herein interchangeably with transistor 10.

Each cell is a floating-gate transistor 10 having a source 12, a drain 11, a floating gate 13, and a control gate 14. Each of the control gates 14 in a row of cells 10 is connected to a row line 15, and each of the row lines 15 is connected to a row line circuit 16, which includes a row line decoder, driver and related circuits.

Each drain 11 and each source 12 in a column of cells 10 is connected to a column line 17. Each column line 17 is connected to a column circuit 18, which may include column decoders, virtual ground decoders, and column pass gates. It should be understood that the location of sources 12 and drains 11 are interchangeable.

As explained below, column lines 17 are used during operation to select any individual cell 10 for programming or reading. Between two adjacent column lines 17 are a group of cells 10, whose sources 12 are connected to one column line 17, and whose drains 11 are connected to the other column line.

As will be explained below, a feature of the invention is that the drain junctions are "abrupt" (A) to improve the programming characteristics of the device. The source junctions are "graded" (G) to minimize programming at the source junction region. As explained below, an abrupt junction is one that has a steeply sloping interface with the channel, whereas a graded junction is gradually sloped. Thus, the left hand side of each column line junction is abrupt, and is used for programming the cell to the left of the junction. The right hand side of each column line junction is graded.

For programming the array, the word line decoder 16 responds to a row address signal on lines 20r and to signals from a control circuit 21. Decoder 16 places a first programming voltage, Vpp, on a selected word line 15, and therefore on the control gates 14 of the cells 10 in the selected row. Column decoder 18 places a second programming voltage, Vwr, on a selected column line 17, and therefore on the drain 11 of the selected cell 10. Vpp and Vwr are about 10–12 volts and 5–8 volts respectively. Vwr is typically Vpp reduced through an impedance.

The intersection of the selected word line 15 and column line 17 is at a particular cell 10 that is to be programmed. The column line 17 common to the source 12 of the selected cell is connected to a reference potential, Vss.

The programming voltages create a high current in the drain channel region of the selected-cell 10. This results in the generation near the drain-channel junction of hot electrons, which are injected across the channel to the floating gate 13 of the selected cell 10. The programming time is sufficiently long to program the floating gate 13 with a negative charge of approximately −2 to −6 volts with respect to the channel region 25.

Non-selected column lines 17 are floated. The column lines 17 on the side of the selected drain 11 charge up to the voltage on the selected column line 17. Thus, there is no voltage difference between source 12 and drain 11 across the channel region and no injection into the floating gates 13 of cells on the side of selected drain 11. The electrons injected into the floating gate 13, in turn, render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits. The column lines 17 on the side of the selected source 12 remain at ground level. Hence no programming occurs in the deselected cells on the side of the selected source 12.

As stated in the background section in connection with FIG. 1A, a problem with prior art EPROM and flash EEPROM arrays is that, during programming, cells 10 on the common word line 15, adjacent to the selected cell 10, on the drain side of the selected cell may be disturbed. This is because of the time it takes for floating source line 19 (the source junction of the adjacent cell) to charge up to Vwr. A basic premise of the invention is the recognition that this disturbance is related to the "abruptness" of the junctions of these adjacent cells with their shared drain line 17. A drain line 17, both of whose junctions with its associated cell pair 10 are abrupt, will cause programming disturbances. Although the abruptness of the junctions is desirable for injection efficiency, programming disturbances can be avoided by making one junction abrupt and the other graded.

Thus, as indicated in FIG. 1B, certain junctions are "graded" to remedy programming disturb problems. The result is a pattern of junctions that are either abrupt (A junctions) or graded (G junctions). As a result, between any adjacent cell pair, one side of the junction is abrupt, and the other side of the junction is graded.

More specifically, when the cell 10a is selected for programming, the unselected cell 10b adjacent to the cell 10a is not programmed, because its source is at Vwr, and its drain floats up to Vwr, whereas in the prior design of FIG. 1A, the drain of cell 10b is at Vwr, and its source floats up to Vwr.

In the read mode, the row line decoder 16 functions, in response to row line address signals on lines 20r and to a signal from control circuit 21, to apply a preselected positive voltage Vcc (approx. +3 to +5 volts) to the selected row line 15 (and the selected control gate 14), and to apply a low voltage (ground or Vss) to deselected row lines 15. The column decoder 18 functions, in response to column address signals on lines 20d, causes a sense amplifier to apply a preselected positive voltage Vsen (approx. +1 to +1.5 volts) to the selected "drain"-column line 17; and the selected "source"-column line 17 is connected to Vss. Deselected column lines 17 may be allowed to float and/or the sense amplifier disconnected from deselected column lines. The conductive or nonconductive state of the cell 10 connected to the selected drain-column line 17 and the selected row line 15 is detected by a sense amplifier connected to the DATA IN/OUT terminal. There are many variations of the read operation, and it is not the main subject of this invention. The read operation may also be performed on the source-junction side of the cells 10 to avoid read disturb.

Erasing may be accomplished by exposure to ultraviolet light, or in other embodiments, by individual electrical erasure of cells 10 or, in other embodiments, by "flash" erase.

For convenience, a table of read, write and erase voltages is given in the Table below:

TABLE

|  | Read | Write | Flash Erase |
|---|---|---|---|
| Selected Row Line | 3–5 V | 10–12 V | −9 to −14 V |
| Deselected Row Lines | 0 V | 0 V | −9 to −14 V |
| Selected Source Line | 0 V | 0 V | 5 V (Vcc) |
| Deselected Source Lines | 0 V | Float | 5 V (Vcc) |
| Selected Drain Line | 1–1.5 V | 5–8 V | 5 V (Vcc) |
| Deselected Drain Lines | Float | Float | 5 V (Vcc) |

Figure 2:
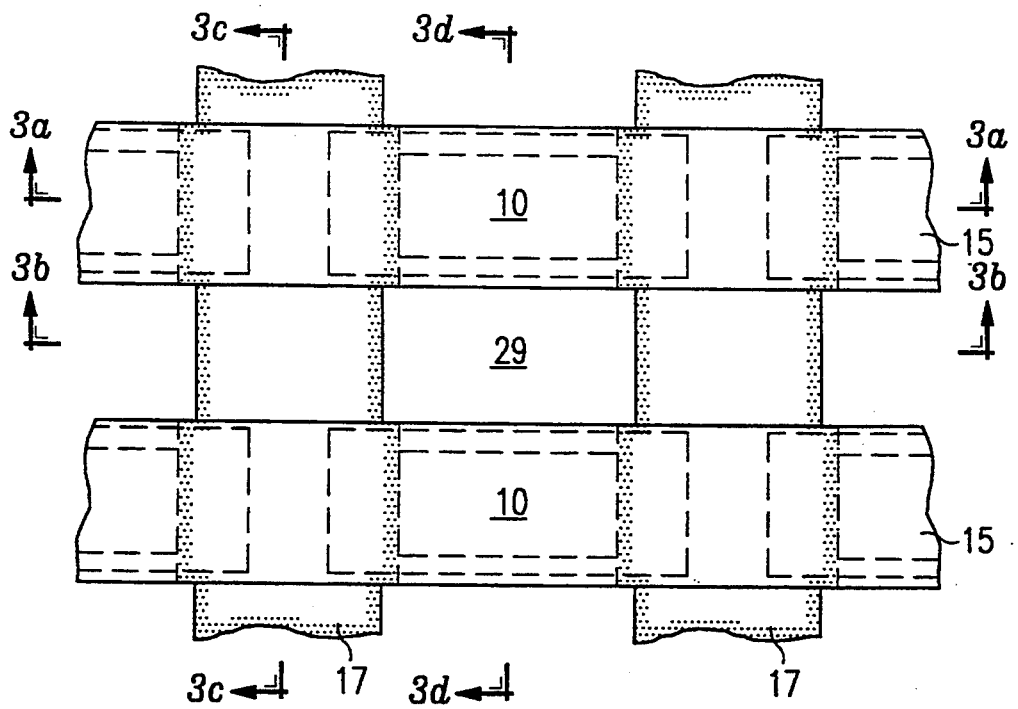
FIG. 2 is a top plan view of part of a virtual ground, single-transistor cell, EPROM array.

FIG. 2 is a top plan view of a part of the memory cell array of FIG. 1B. FIGS. 3A–3D are elevation view of the same array taken along lines A—A, B—B, C—C, and D—D of FIG. 2. Only two cells 10 and their connection lines 15 and 17 are shown—it should be understood that cells 10 are part of an array having a much larger number of such cells.

The particular array structure of FIGS. 2 and 3A–3D is referred to as a "contact free" structure. No source/-drain contact is needed in the vicinity of cell 10. However, the invention can be used with other virtual ground, EPROM array architectures. An example of another such structure is the "x-cell" architecture, described in U.S. Pat. No. 4,281,397.

The array is formed on the surface of a semiconductor body 22, which may be a silicon substrate layer. Row lines 15, which incorporate a control gate 14 at each cell 10, are formed from second level polysilicon (poly 2) strips that extend along the face of substrate 22.

Each column line 17 consists of a metal line running above insulator 24, and the S/D junction formed beneath a thermal insulator region 24. These buried lines 17 include the drain regions 11 and source regions 12 for each cell 10. Each column line 17 is shared by pairs of cell 10 along a column of the array.

At each cell 10, the junction of its drain region 11 with the column line 17 and the junction of its source region 12 with the column line 17 are designated as being "A" (abrupt) or "G" (graded), respectively. Thus, the left side of each junction is abrupt, and the right hand side is graded.

A channel 25 separates the drain region 11 and source region 12 of each cell 10. The channels 25 of cells 10 in adjacent rows are isolated by thick field oxide regions 29 and the channel stop region 27. Other channel isolation techniques may be used, as discussed in U.S. Pat. Nos. 5,025,494 and 5,051,796. A gate insulator 77, such as an oxide layer, is over channel 25.

Control gates 14 are separated from floating gates 13 by oxide-nitride-oxide (ONO) composite inter-level insulator layer 23. A floating gate 13 for each cell 10 is formed by a first level polysilicon (poly 1) layer extending across a channel 25 between the spaced-apart drain region 11 and source region 12. Each floating gate 13 also extends across at least parts of thermal insulator regions 24, which improves the capacitance between gate 13 and gate 14 as compared to the capacitance between gate 13 and drain region 11 or source region 12. Therefore, a large fraction of the programming voltage Vpp on control gate 14 will be capacitively coupled to floating gate 13.

Figure 3A:
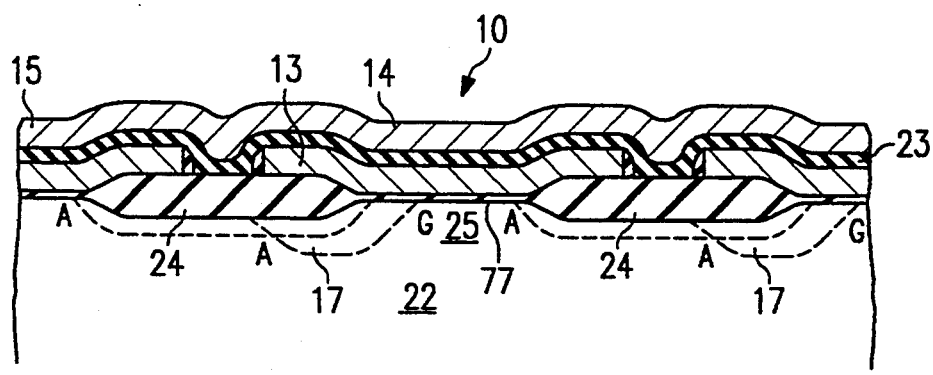
FIGS. 3A–3D are elevation views of the array of FIG. 2, taken along lines A—A, B—B, C—C, and D—D, respectively.
Figure 3B:
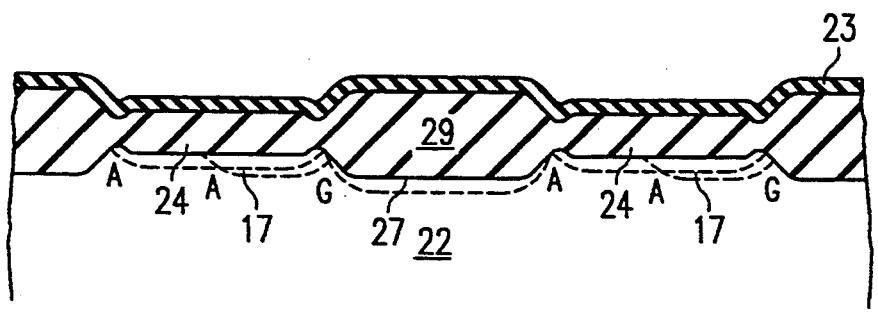
Figure 3C:
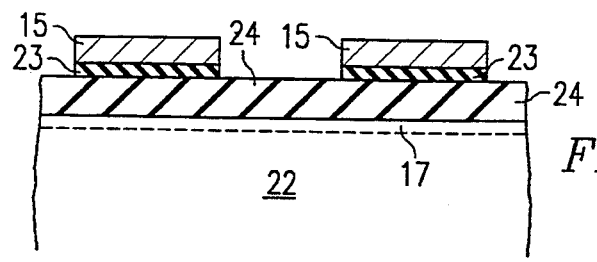
Figure 3D:
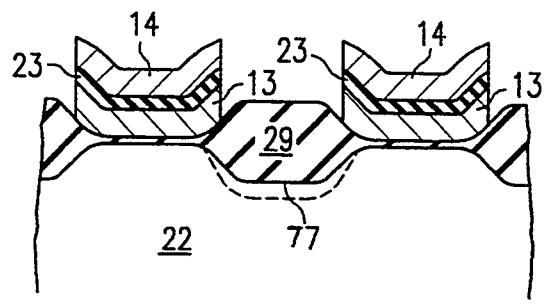
Figure 4A:
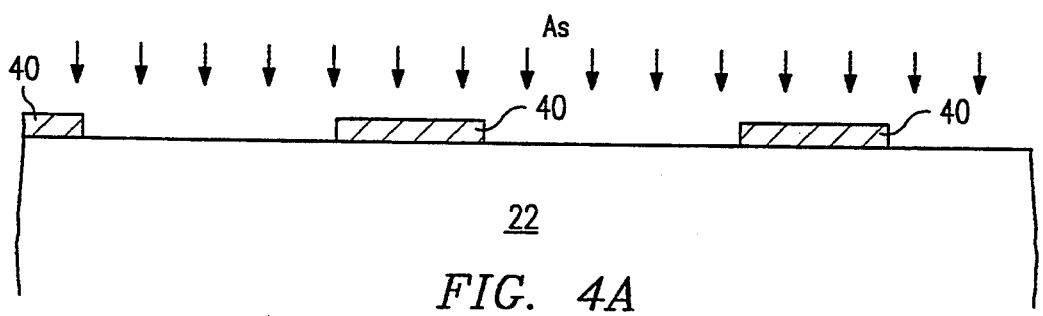
FIGS. 4A–4C illustrate a process of making abrupt and graded junctions.
Figure 4B:
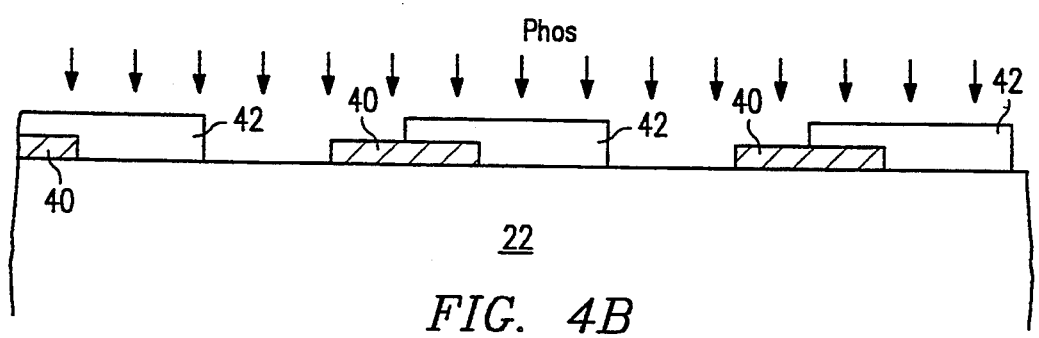
Figure 4C:
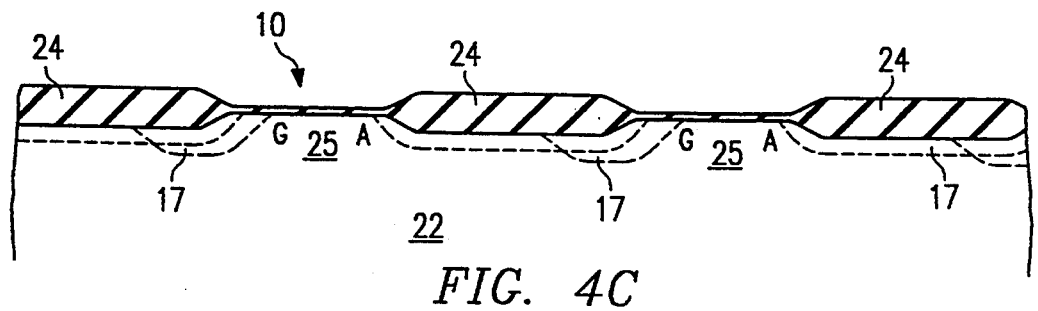

FIGS. 4A–4C illustrate a method of making drain regions 11 and source regions 12 for a non volatile memory cell array, which has abrupt and graded junctions in accordance with the invention. Like the array of FIGS. 2 and 3A–3D, the array of FIGS. 4A–4C is a contact-free array. FIGS. 4A–4C correspond to FIGS. 3A–3D in that the process of FIGS. 4A–4C will result in a partially completed wafer whose structure appears the same. FIGS. 4A–4C are partially fabricated views of FIG. 3A.

For the fabrication process, the starting material is a slice of p-type silicon of which the semiconductor layer, or substrate, 22 is a small portion. A number of processes would be performed to create transistors peripheral to the array, and these are not discussed here. For example, the memory device may be of the CMOS (complementary field-effect) type having n-wells and p-wells in substrate 22 for the purpose of forming peripheral transistors.

Several preliminary steps, which occur prior to the process shown in FIG. 4A, are not shown. A layer of pad oxide is grown or deposited on substrate 22. A silicon nitride layer is then deposited. Both depositions are typically by means of a chemical vapor deposition process. The pad oxide and silicon nitride layers are then patterned and plasma-etched to expose areas where any field oxide, such as the thick oxide 29 of FIG. 3D, is to be formed. A boron implant is performed to create a p+ channel stop region 27. After removing the photoresist, the thick oxide regions 29 are grown, typically with a LOCOS (localized oxidation) process. Following oxidation, any nitride converted to oxide is removed, followed by removal of the silicon nitride and pad oxide. A thin oxide in the range of 200A–500A, (not shown) is grown to eliminate the Kooi effect.

FIG. 4A illustrate an abrupt-junction doping step. A photoresist layer 40 is formed on the surface of substrate 22. The photoresist is patterned into a photoresist pattern, which defines active areas and acts as an implant mask for selectively doping column lines 17. A first doping process is performed with an arsenic implant. A typical arsenic dose is about $6 \times 10^{15}$ cm$^2$ at an energy of 135 KeV.

FIG. 4B illustrates the graded-Junction doping step. A second photoresist layer 42 is patterned over the first photoresist layer 40. This second pattern exposes a portion of each column line 17 to a phosphorous implant. A typical dose for the phosphorous is $1 \times 10^{14}$ to $1 \times 10^{15}$ cm$^{-2}$ at an energy of 30 to 100 KeV.

FIG. 4C illustrates the result of the first and second doping steps of FIGS. 4A and 4B, as well as the formation of thermal insulator regions 24. The doping has created column lines 17, including drain regions 11 and source regions 12. The abrupt portions correspond to those areas that were doped only with arsenic, whereas the graded portions correspond to areas that were doped with both arsenic and phosphorous.

Referring again to FIG. 3A, as well as to FIG. 4C, the relationship of abrupt and graded portions of drains 11 and sources 12 to respective column lines 17 can be seen. One side of each column line is an abrupt junction, and the other graded. Adjacent cells 10 share a column line 17. Each cell is associated with a column line 17, and has a channel-drain junction and a channel-source junction. One of these junctions is graded and one is abrupt.

After the doping of the column lines 17, photoresist layers 40 and 42 are removed. Then the thin oxide, discussed above in connection with preliminary steps, is removed, a clean-up is done, and anneal steps are performed.

Referring to FIG. 4C, an oxidation step is then performed to grow thermal insulator regions 24. Typically, this step is accomplished with steam at 800-900 degrees centigrade. The thermal oxide regions 24 are grown to a thickness of about 1000-3000 angstroms. At the same time, an oxide insulator layer 32 between drains 11 and sources 12 is grown to a thickness of about 150-300 angstroms. A threshold voltage adjusting implant may now be performed in the channels 25.

The structure formed by remaining process steps is shown in FIG. 3A. The insulator layer 32 is etched away and a new layer 77 formed to a thickness of about 80-110 angstroms. A poly 1 layer, which will become floating gates 13 is deposited and doped with an N-type dopant. The poly 1 layer is patterned with a photoresist and etched to form floating gate strips parallel to column line 17. This is followed by a photoresist removal and clean-up. Sidewall oxide is formed on the edges of the strips.

Inter-level insulator layers 23 is then formed from 3 sublayers (ONO). A first sublayer is a deposited or grown silicon oxide layer. A second sublayer 23b is a deposited silicon nitride layer. A third sublayer is a silicon oxide layer partially converted from silicon nitride. Typical thicknesses of these ONO sublayers are: oxide 50-200A, nitride 100-200A, and top oxide 10-50A.

A poly 2 layer, which will become control gates 14 and word lines 15, is then deposited and highly n+. After de-glazing and patterning, a stack etch of the poly 2 layer, the insulator layer 23, and the poly 1 strips, is performed. This stack etch defines a plurality of word lines 15, which incorporate a control gate 14 at each cell 10.

Further details of the fabrication process steps are discussed in U.S. Pat. Nos. 5,025,494 and 5,051,796. Thus, steps after the poly 2 etch are not discussed in detail herein.

Peripheral logic devices may be fabricated after the above steps. An oxide layer may be formed around the exposed portions of poly 1/poly 2 for improved data retention. Various contacts may be formed, followed by metal and protective overcoat processes.

For other such designs, such as an X-cell design, an example of which is described in U.S. Pat. No. 4,281,397, the layout of the column lines 17 and word lines 13 might change from the parallel layout discussed above. For example, in an X-cell the word lines 15 form a zig-zag pattern.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An array of nonvolatile memory cells, comprising:
   a semiconductor layer of a first conductivity type;
   a number of memory cells, each cell having at least one transistor, with a source region, a drain region, a floating gate, and a control gate;
   a number of row lines for connecting the control gates of each row of cells of said array;
   a number of column lines for connecting the drain regions of columns of cells of said array, and the source regions of the next adjacent column of cells of said array;
   such that row-adjacent cell-pairs share a column line;
   wherein each column line has a first junction with the source/drain of one cell of its associated cell-pair that is abrupt and has a second junction with the source/drain of the other cell of its associated cell-pair that is graded; and
   wherein said source regions and drain regions are buried under thermal insulator regions.

2. The memory cell array of claim 1, wherein said abrupt junctions are made by doping a portion of said source or drain region with a single dopant.

3. The memory cell array of claim 2, wherein said single dopant is arsenic.

4. The memory cell array of claim 1, wherein said graded junctions are made by doping a portion of said source or drain regions with multiple dopants.

5. The memory cell array of claim 4, wherein said multiple dopants are arsenic and phosphorous.

6. The memory cell array of claim 1, wherein said row lines and said column lines are perpendicular.

7. The memory cell array of claim 1, wherein said first junction corresponds to a drain region.

8. The memory cell array of claim 1, wherein said second junction corresponds to a source region.

* * * * *